(12) United States Patent
Zheng

(10) Patent No.: US 9,894,791 B2
(45) Date of Patent: Feb. 13, 2018

(54) IMPLEMENTATION METHOD FOR STACKED CONNECTION BETWEEN ISOLATED CIRCUIT COMPONENTS AND THE CIRCUIT THEREOF

(71) Applicant: SHENZHEN XILONG TOY COMPANY LIMITED, Shenzhen (CN)

(72) Inventor: Yipu Zheng, Shenzhen (CN)

(73) Assignee: SHENZHEN XILONG TOY COMPANY LIMITED, Shenzhen (CN)

( * ) Notice: Subject to any disclaimer, the term of this patent is extended or adjusted under 35 U.S.C. 154(b) by 0 days.

(21) Appl. No.: 15/258,788

(22) Filed: Sep. 7, 2016

(65) Prior Publication Data

US 2017/0311470 A1 Oct. 26, 2017

(30) Foreign Application Priority Data

Apr. 25, 2016 (CN) .......................... 2016 1 0259246

(51) Int. Cl.
*H01L 23/02* (2006.01)
*H05K 7/00* (2006.01)
*H01L 25/16* (2006.01)
*H01L 23/482* (2006.01)
*H01L 23/00* (2006.01)

(52) U.S. Cl.
CPC ......... *H05K 7/005* (2013.01); *H01L 23/4824* (2013.01); *H01L 24/05* (2013.01); *H01L 24/06* (2013.01); *H01L 24/80* (2013.01); *H01L 25/16* (2013.01); *H01L 2224/0556* (2013.01); *H01L 2224/05553* (2013.01); *H01L 2224/06183* (2013.01); *H01L 2224/80203* (2013.01); *H01L 2224/80238* (2013.01)

(58) Field of Classification Search
CPC ..... H05K 7/005; H01L 25/16; H01L 23/4824; H01L 24/05; H01L 24/80; H01L 24/06
See application file for complete search history.

(56) References Cited

U.S. PATENT DOCUMENTS

| | | | | |
|---|---|---|---|---|
| 2,805,311 | A * | 9/1957 | Fluegel | G05D 23/2453 219/483 |
| 6,320,255 | B1 * | 11/2001 | Terrill | H01L 21/28562 257/686 |
| 2009/0001541 | A1 * | 1/2009 | Covert | H01L 25/105 257/686 |

* cited by examiner

*Primary Examiner* — Long Pham
(74) *Attorney, Agent, or Firm* — Anova Law Group, PLLC

(57) ABSTRACT

The present invention discloses an implementation method for stacked connection between isolated circuit components, whose setting is according to at least two circuit components connecting in parallel/series in a circuit, wherein, in accordance with a circuit connection configuration, a plurality of corresponding pins of the components are soldered directly, making the components form an integrated module in accordance with a desired connection configuration of the circuit, and saving circuit boards and wires. Comparing to the circuit limited in a PCB in the prior art, it is possible to construct a circuit unit by welding connection in a way of building-block approach, achieving a circuit in a 3D space through directly welding between components, and owning a wider design space, it may shorten the time used for a circuit from design to process.

7 Claims, 5 Drawing Sheets

IMPLEMENTATION METHOD FOR STACKED CONNECTION BETWEEN ISOLATED CIRCUIT COMPONENTS AND THE CIRCUIT THEREOF

CROSS-REFERENCES TO RELATED APPLICATIONS

This application claims the priority of Chinese patent application no. 201610259246. X, filed on Apr. 25, 2016, the entire contents of all of which are incorporated herein by reference.

FIELD OF THE INVENTION

The present invention relates to a circuit hardware implementation method and the circuit thereof, and, more particularly, to a brand new circuit building method and the circuit apparatus thereof.

BACKGROUND

For a circuit arrangement method in the prior art, except for an integrated circuit (IC) adopting a highly integrated circuit connection method, a plurality of conventional circuits and peripheral circuits around an IC chip are still adopting an isolated circuit, that is, a circuit is connected by adopting a plurality of isolated circuit components according to a circuit schematics, so as to achieve a function of the circuit.

A commonly used isolated circuit components mainly includes: a resistor, a capacitor, a diode, a triode etc., wherein, a conventional circuit component is welded onto a printed circuit board (PCB), by adopting a method of soldering pins; of course, a simple circuit may also be connected directly by wires, such as some circuits for experimental units.

Following a progress of a circuit processing art, specifically, in order to be convenient for an automatically soldering and processing art, currently, the isolated circuit components are no longer adopting the method of soldering pins, instead, a method of designing an electric component as a chip shape is adopted, including the resistor, the diode, the triode and more, specifically, by sharing a chip processing art of an IC chip, each chip component may be mounted onto the PCB through an automatic chip welding machine.

However, no matter either the above said conventional pins soldering art, or the chip components mounting art, generally, a component is welded onto a PCB, while for a printed circuit board, that is, a PCB, usually, it is pre-designed before being pre-processed well in a PCB processing plant, in order to pre-print the majority of circuit wires onto a plate of electric insulation material, and circuits are printed on this insulation material following a pre-designed circuit configuration.

This kind of conventional circuit design method is subjected to a 2D printing art of the circuit board, the whole circuit is limited by sizes of the circuit board, while the circuit shall be distributed and formed on a circuit board plane; also, due to a requirement of using circuit boards, whose space size may not be designed flexibly, thus, a volume of the designed circuit board may not adapt to any small size products.

Therefore, the current technology needs to be improved and developed.

BRIEF SUMMARY OF THE DISCLOSURE

According to the above described defects, the purpose of the present invention is providing an implementation method for stacked connection between isolated circuit components and the circuit thereof, whose circuit implementation method may be considered in a 3D space, without any PCBs or wires, to achieve a simple but unrestricted free circuit and the implementation method thereof.

In order to achieve the above mentioned goals, the technical solution of the present invention to solve the technical problems is as follows:

an implementation method for stacked connection between isolated circuit components, whose setting is according to at least two circuit components connecting in parallel/series in a circuit, wherein, in accordance with a circuit connection configuration, a plurality of corresponding pins of the components are soldered directly, making the components form an integrated module in accordance with a desired connection method of the circuit, and saving circuit boards and wires.

The said implementation method for stacked connection between circuit components, wherein, the said components include a resistor, the said resistor is designed in a square shape, and a plurality of bonding pads are arranged on at least two end faces.

The said implementation method for stacked connection between circuit components, wherein, the said resistor has a bonding pad arranged on at least one body side face, which connects with that on the corresponding end face electrically.

The said implementation method for stacked connection between circuit components, wherein, a length of the bonding pad arranged on the said body side face of the said resistor is set exceeding half length of the said side face.

The said implementation method for stacked connection between circuit components, wherein, the said components further include a diode, the said diode is designed in a square shape, and two bonding pads are arranged, being able to distinguish different current directions.

The said implementation method for stacked connection between circuit components, wherein, the said components further include a triode, the said triode is designed in a square shape, and three corresponding different bonding pads are arranged on the square shape, according to a base electrode, a collector and an emitter.

The said implementation method for stacked connection between circuit components, wherein, the three bonding pads of the said triode are designed into three consequent modules, and the said base electrode is designed in the middle.

A modular circuit of isolated circuit, wherein, the said isolated circuit includes at least two circuit components connecting in parallel/series; the said circuit components, in accordance with the circuit connection configuration, whose corresponding pins are soldered directly, making the components form an integrated module in accordance with a desired connection method of the circuit, saving circuit boards and wires.

The said modular circuit, wherein, the said components include a resistor, the said resistor is designed in a square shape, and bonding pads are arranged on at least two end faces.

The said modular circuit, wherein, the said components further include a diode, the said diode is designed in a square shape, and two bonding pads are arranged, being able to distinguish different electric current directions.

The said modular circuit, wherein, the said components further include a triode, the said triode is designed in a square shape, and three corresponding different bonding pads are arranged on the square shape, including the base electrode, the collector and the emitter.

The implementation method for stacked connection between isolated circuit components and the circuit thereof, as provided in the present invention, due to adopting a plurality of modularized components, and bonding pads arranged on the components for welding conveniences, it is possible to construct a circuit unit by welding connections in a way of building blocks, so as to achieve a circuit easy to design and process, which needs no PCB presence, instead, forms a circuit unit simply by soldering and splicing different components only, so as to form a circuit being able to save the circuit board space, and break a limit of a 2D circuit board, also, the design and implementation method is not limited to that on a 2D plane, it may be achieved in a 3D space through directly welding between components, and comparing to the circuits limited in a circuit board plane as a PCB in the prior art, it owns a wider design space, also, it may shorten the time used for a circuit from design to build-up.

BRIEF DESCRIPTION OF THE DRAWINGS

FIG. 6 illustrates a schematic diagram on other equal implementations of the stacking method shown in FIG. 5a.

DETAILED DESCRIPTION OF EMBODIMENTS

The present invention provides an implementation method for stacked connection between isolated circuit components and the circuit thereof, in order to make the purpose, technical solution and the advantages of the present invention clearer and more explicit, further detailed descriptions of the present invention are stated here, referencing to the attached drawings and some preferred embodiments of the present invention. It should be understood that the detailed embodiments of the invention described here are used to explain the present invention only, instead of limiting the present invention.

The implementation method for stacked connection between isolated circuit components and the circuit thereof, as provided in the present invention, whose setting is point to at least two circuit components connecting in series or parallel in a circuit. Both the method and the circuit provided in the present invention need no circuit boards, instead, the circuit components are set in a regular shape, and interconnected in a docking or welding way, to achieve a stacked modular circuit, and from a view angle of stability of the circuit, connecting in welding is more preferred than that in docking. Due to adopting a stacked modular circuit structure, it may execute a free design in a 3D space according to a plurality of relatively simple circuits, so as to break a thinking way in the prior art for designing a circuit relying on a PCB, and requiring a 2D circuit design. Of course, for a relatively complicated circuit configuration, a mathematical topological structure principle is required for designing, and a core part of the relatively complicated circuit may adopt an IC design, and further design an IC chip in a modular way matching the modular circuit in the present invention, so as to facilitate welding and forming an operation circuit.

Each component in the circuit of the present invention may be stacked properly, following a plurality of connection configuration requirements of the schematic diagram of the circuit, and adopting a plurality of connection methods to generate an electric connection, including soldering or docking a plurality of corresponding pins directly, making components form an integrated module and in a stacked way, in accordance with the connection method required by the circuit diagram, saving circuit boards and wires, it generates a design approach of a small and flexible volume, and forms a 3D circuit module according to a plurality of space requirements of the product circuit, therefore achieves a function of the circuit.

Figure 1:
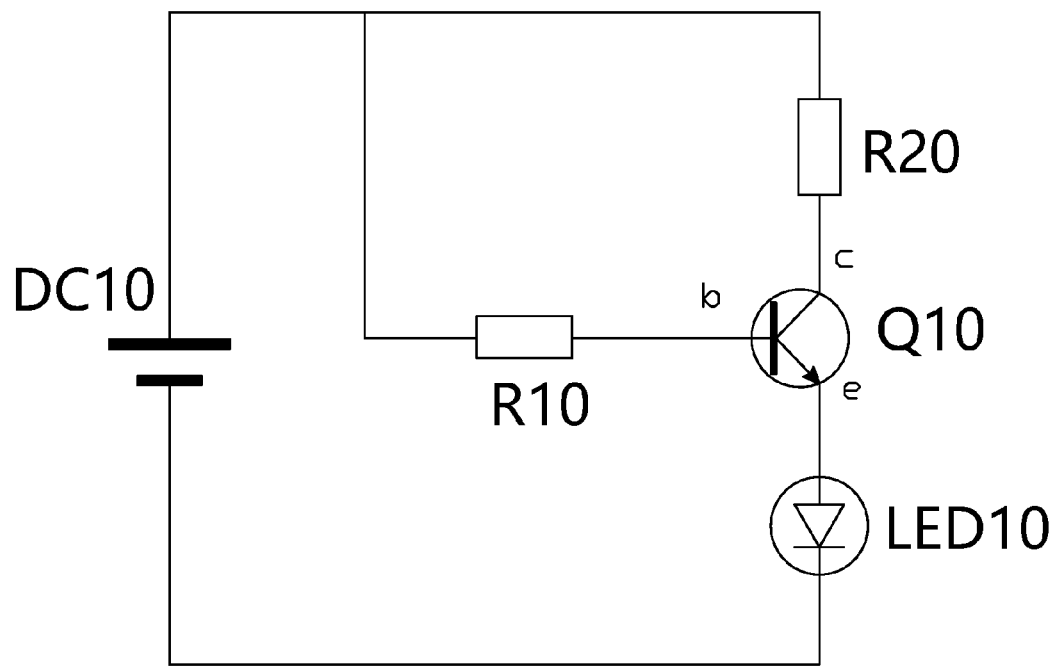
FIG. 1 illustrates a schematic diagram on the circuit of a first preferred embodiment of the present invention.
Figure 7:
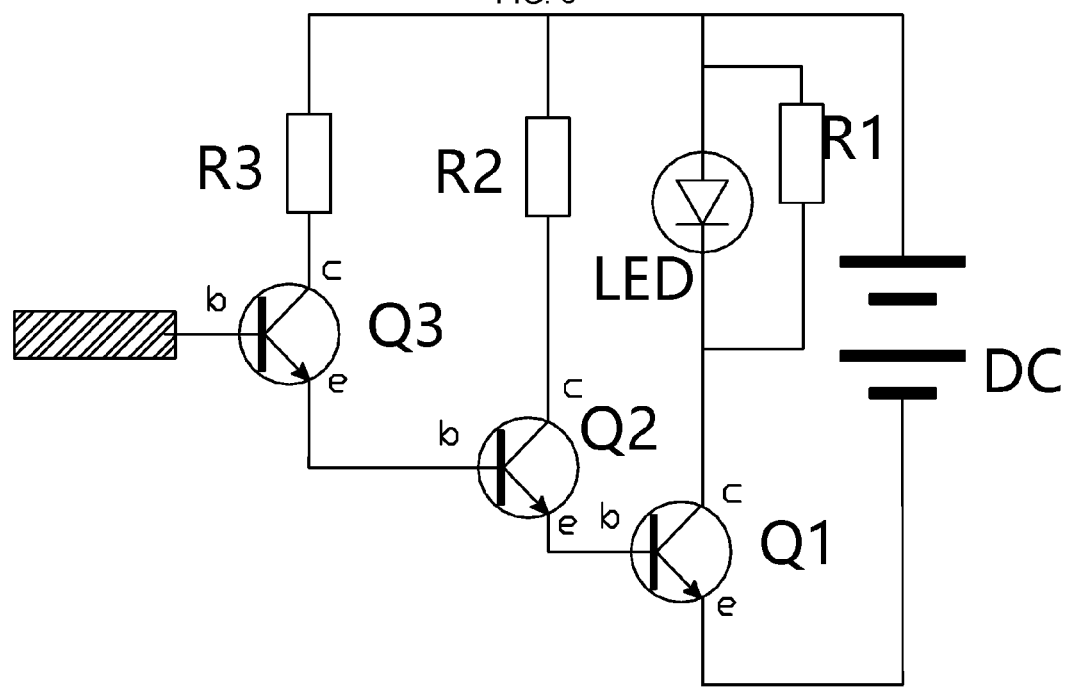
FIG. 7 illustrates a schematic diagram on the circuit of a second preferred embodiment of the present invention.

In the implementation method for stacked connection between each component as described in the present invention, and the circuit configuration thereof, the said component includes a plurality of resistors R10, R20, as shown in FIG. 1, or resistors R1, R2, R3, as shown in FIG. 7, each resistor owns a similar configuration, except for the resistance value, which is a square shape, such as a rectangular shape, and its specific sizes may be configured into different standard sizes in accordance with any real requirements or electric features, such as heat dispersion requirements, for each resistor, at least one bonding pad 110 is arranged on each of both end faces. In such a way, resistors connected in series may be configured by welding connections extending from end to end.

Figure 3:
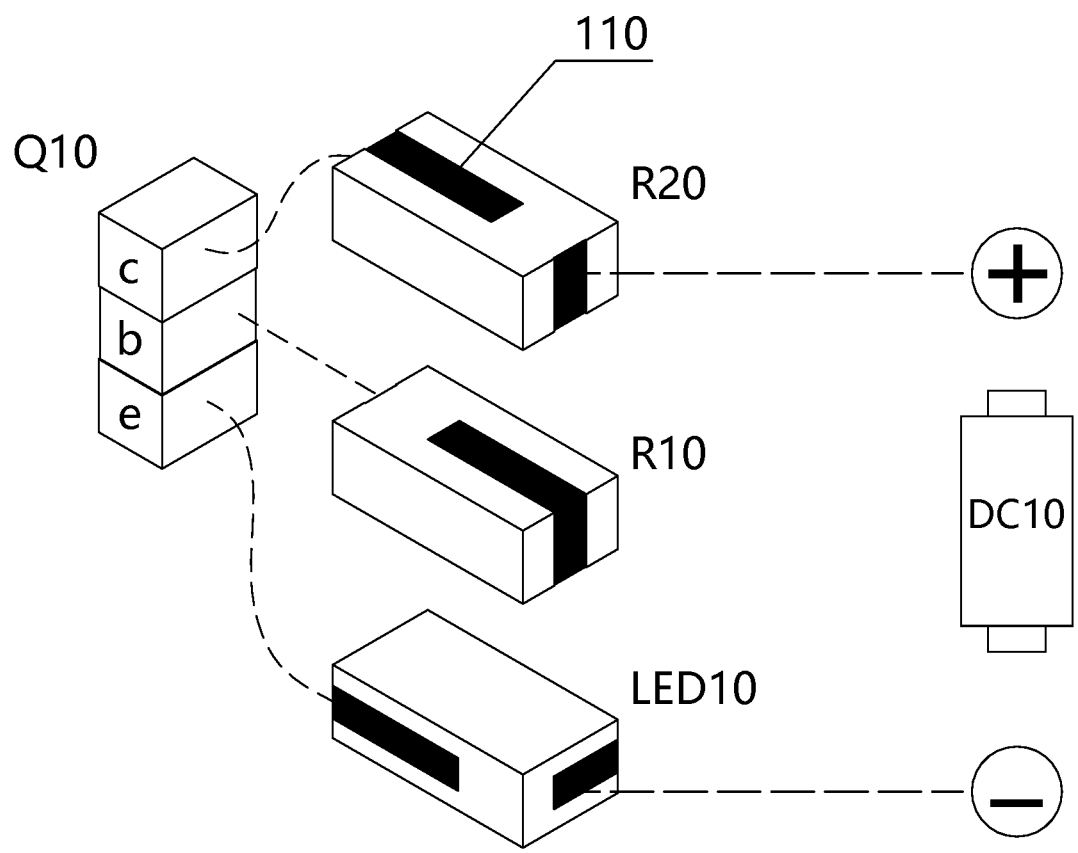
FIG. 3 illustrates a circuit modular diagram of the present invention according to the schematic diagram of the circuit shown in FIG. 1.
Figure 4:
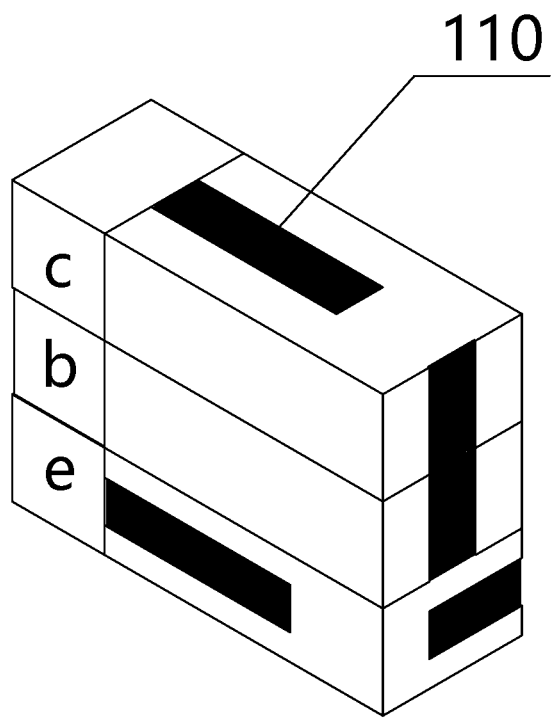
FIG. 4 illustrates a schematic diagram on a modular product of the circuit provided in the present invention, corresponding to the schematic diagram of the circuit shown in FIG. 3.

Preferably, the bonding pad on the said resistor may be designed into an L shape, extending from an end face to a body face, that is, arranging a bonding pad on at least one body face electrically connecting to that arranged on the corresponding end face, and it may be configured that, a length of the bonding pad arranged on the said body face exceeds half length of the side, as shown in FIG. 3 and FIG. 4.

Figure 5A:
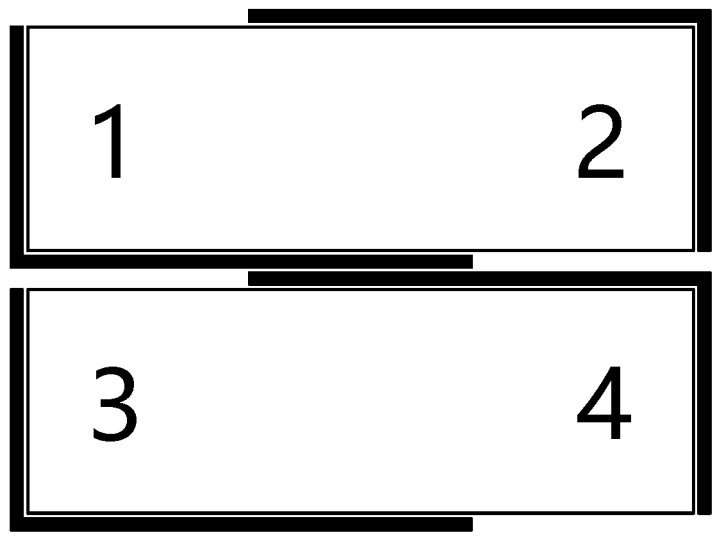
FIG. 5a illustrates a schematic diagram on a most basic circuit connection method in the present invention, that is, a welding connection diagram on a series connection.
Figure 5B:
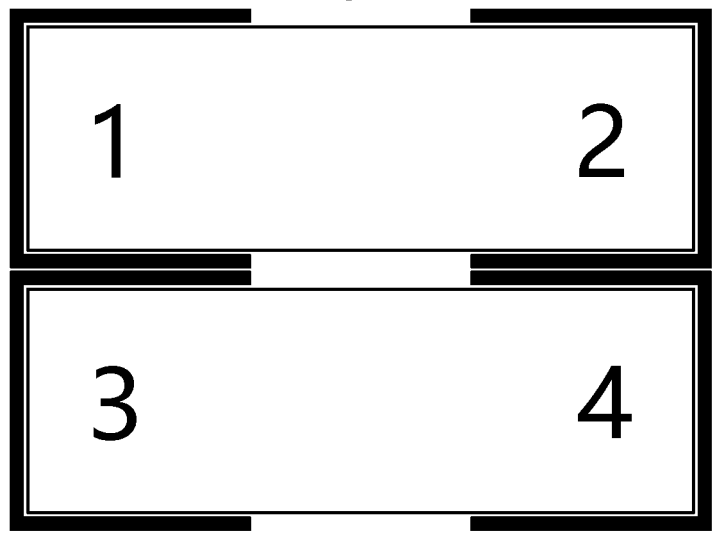
FIG. 5b illustrates a schematic diagram on a most basic circuit connection method in the present invention, that is, a welding connection diagram on a parallel connection.

A specific connection principle is shown in FIGS. 5a and 5b, as shown in FIG. 5a, the welding method for a series connection is welding bonding pads exceeding half length of the body side faces of both components arranged in parallel, and it equals to a series connection of both resistors; as shown in FIG. 5b, when connecting in parallel, both bonding pads on both end faces of the said components may be arranged extending to side faces, so as to welding between bonding pads on both sides when both components are arranged in parallel, and forming a connection in parallel.

What are shown in both FIG. 5a and FIG. 5b are two basic unit connection methods, while all other circuit configurations in either parallel or series, may be achieved through combinations of the above said two basic connection methods respectively, while for different connection methods, bonding pads on the said components of the present invention, may be arranged adopting different configuration feathers, for example, an L-shaped bonding pad structure shown in FIG. 5a is the one suitable for connection in series, while a C-shaped square bonding pad structure shown in FIG. 5b is the one suitable for connection in parallel. In the configurations arrangement of the bonding pads on the said components of the present invention, it may arrange a plurality of different configuration standards to distinguish the connection method of the resistor, either in series or in parallel, as well as a plurality of configuration methods of other components, especially a polarity setting of a diode and more, while standards for these configurations need a further development.

Figure 2:
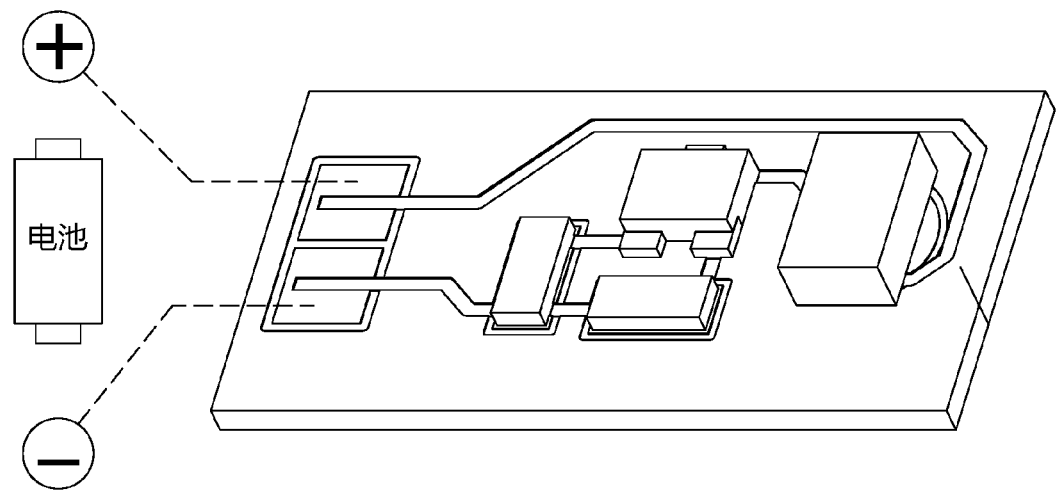
FIG. 2 illustrates a circuit board diagram on the prior art according to the schematic diagram of the circuit shown in FIG. 1.

What is shown in FIG. 2 is a circuit board diagram on the implementation method of the PCB circuit in the prior art, wherein, each component needs to be welded in patches or in dockings onto a reserved position on a pre-printed circuit board, and a formed product of the circuit is obviously different to that in the present invention, while the product in the present invention owns a modular configuration after being formed, and under a plurality of corresponding designed conditions, it may form a specific shape for docking, for example, in addition to a shape adapting to a space locating the circuit, it may also form different shapes in a space, including that of a person or an object.

In the implementation method for stacked connection between isolated circuit components and the circuit module thereof, the said components further include components with polarized connection directions, such as a diode, as shown in FIG. 3 and FIG. 4, the said diode may be arranged in the same shape of the resistor, that is, a square shape, preferably, arranging two bonding pads being able to distinguish different current directions for the connection direction of the diode, such as adding a labeled pattern or a plurality of raised dots, and a more preferably design method is, arranging an unbalanced bonding pad, so as to ensure the polarization usage of the diode.

Figure 6:
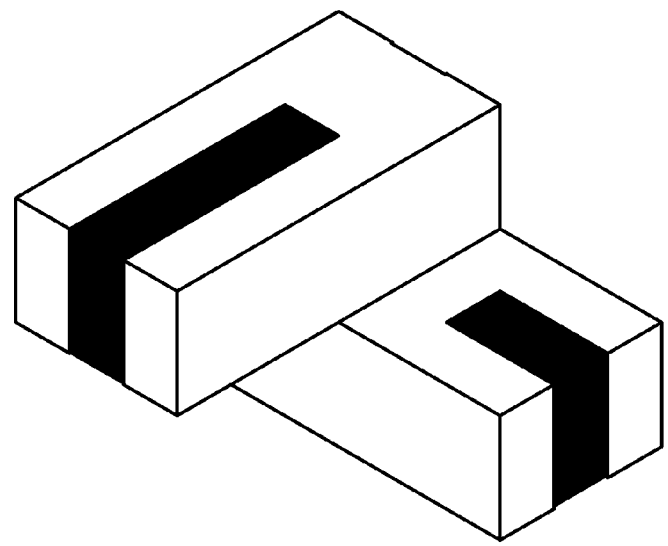
Figure 8:
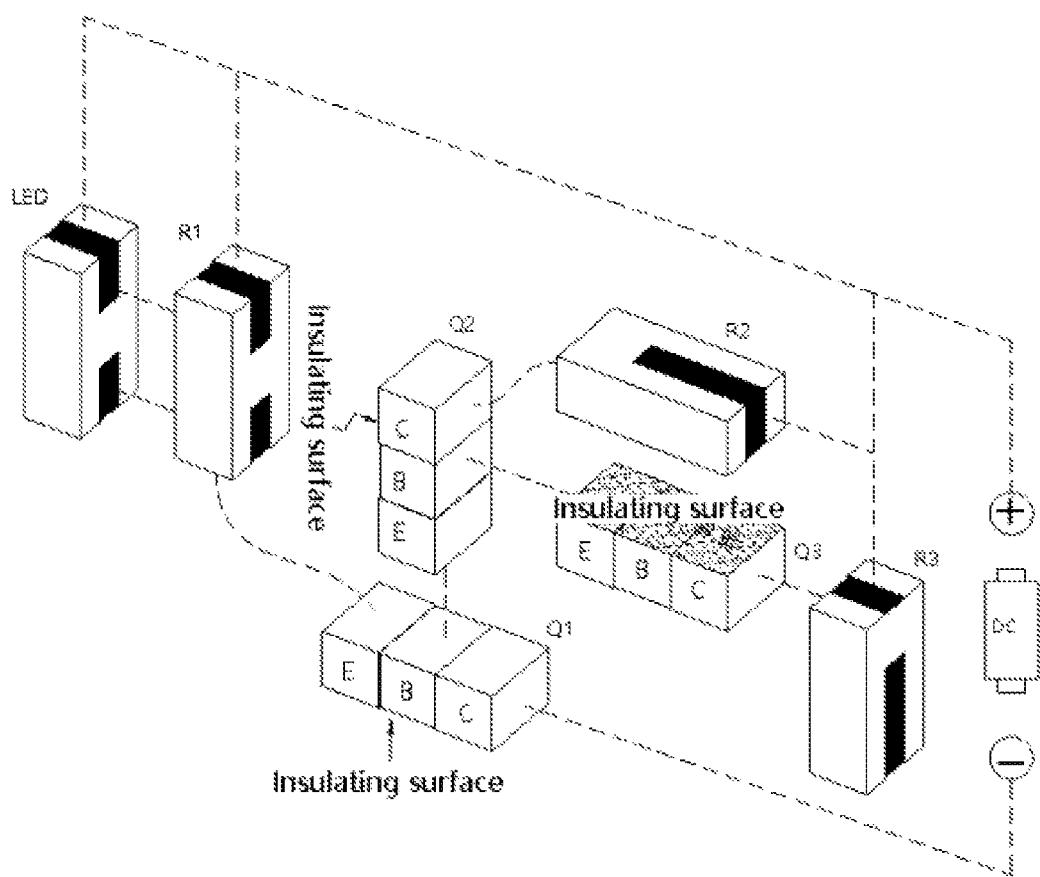
FIG. 8 illustrates a circuit modular diagram of the present invention according to the schematic diagram of the circuit shown in FIG. 7.
Figure 9:
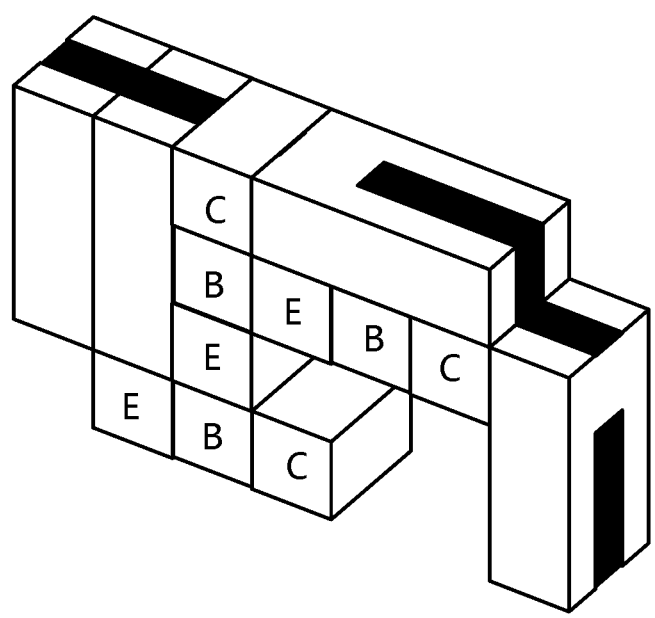
FIG. 9 illustrates a schematic diagram on the modular product of the circuit provided the present invention corresponding to the schematic diagram on the circuit shown in FIG. 7.

In the implementation method for stacked connection between isolated circuit components and the circuit thereof, the said components further include components having more bonding pads, for example, a triode and an IC chip, the said triode is also arranged in a square shape, and three different bonding pads are arranged onto the square shape, including each for a base electrode, a collector and an emitter, such as an amplifier and superposition circuit shown in FIG. 8 and FIG. 9, which may be applied into a sensor switching circuit. The said triode is arranged with three bonding pads of E, B, C, wherein, the said module for base electrode, that is, the B module, is arranged in a middle position (for different bonding configurations, the bonding pads for three electrodes may also be arranged in other configurations, for example, setting the B module for base electrode onto an end side), and one side face of the whole triode product is set as an insulating surface, while other corresponding faces are connected with other components including resistors or diodes, a modular product after specific connections is shown in FIG. 9, however, a specific topology structure of the product is not limited to the above said combination methods, and the design for bonding pads of the circuit components is also not limited to that of each embodiment of the implementations. Shown as FIG. 6, it is also possible to adopt other stacking methods to achieve the connection in series shown as FIG. 5a. Since there is no limit from either face or frame of the circuit board, the possibility of realizing a circuit following the stacking method provided in the present invention is much higher than that of a conventional PCB method, and it owns a more flexible design space.

The modular circuit for an isolated circuit as provided in the present invention, wherein, the said isolated circuit includes at least two circuit components for connections in series or in parallel; the said circuit components, in accordance with the circuit connection configurations, wherein, the corresponding pins of the components are soldered directly, making the components form an integrated module in accordance with a desired connection method of the circuit, saving circuit boards and wires. Wherein, the said components include resistors, diodes, triodes and more, all are designed in a square shape, while bonding pads are arranged for welding purposes. No matter for a relatively simple isolated circuit or a relatively complex one, through the modular welding configurations described above, it is possible to achieve a circuit module without any circuit boards or wires, so as to facilitate the realization of a circuit product in a small space, and the design is free in spaces, thus it helps to produce a brand new circuit module.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:

1. An implementation method for stacked connection between a plurality of isolated circuit components, each of the plurality of isolated circuit components including at least an insulating surface and a pin, comprising:
   directly connecting a first pin of a first isolated circuit component with a first pin of a second isolated circuit component;
   directly connecting a second pin of the first isolated circuit component with a first pin of a third isolated circuit component;
   directly connecting an insulating surface of the second isolated circuit component with an insulating surface of the third isolated circuit component; and
   making the plurality of isolated circuit components form an integrated module in accordance with a desired connection configuration of a circuit, and saving circuit boards and wires.

2. The implementation method for stacked connection between the plurality of isolated circuit components according to claim 1, wherein, the plurality of isolated circuit components include a resistor, the resistor is designed in a square shape, and a plurality of bonding pads are arranged on at least two end faces.

3. The implementation method for stacked connection between the plurality of isolated circuit components according to claim 2, wherein, the resistor has a bonding pad arranged on at least one body side face, which connects with that on the corresponding end face electrically.

4. The implementation method for stacked connection between the plurality of isolated circuit components according to claim 3, wherein, a length of the bonding pad arranged on the body side face of the resistor is set exceeding half length of the side face.

5. The implementation method for stacked connection between the plurality of isolated circuit components according to claim 1, wherein, the plurality of isolated circuit components further include a diode, the diode is designed in a square shape, and two bonding pads are arranged, being able to distinguish different current directions.

6. The implementation method for stacked connection between the plurality of isolated circuit components according to claim 1, wherein, the plurality of isolated circuit components further include a triode, the triode is designed in a square shape, and three corresponding different bonding pads are arranged on the square shape, according to a base electrode, a collector and an emitter.

7. The implementation method for stacked connection between the plurality of isolated circuit components according to claim 6, wherein, the three bonding pads of the triode are designed into three consequent modules, and the base electrode is designed in the middle.

* * * * *